United States Patent
Foti

(10) Patent No.: US 9,820,073 B1
(45) Date of Patent: Nov. 14, 2017

(54) EXTRACTING A COMMON SIGNAL FROM MULTIPLE AUDIO SIGNALS

(71) Applicant: TLS Corp., Cleveland, OH (US)

(72) Inventor: Frank Foti, Lakewood, OH (US)

(73) Assignee: TLS Corp., Cleveland, OH (US)

( * ) Notice: Subject to any disclaimer, the term of this patent is extended or adjusted under 35 U.S.C. 154(b) by 0 days.

(21) Appl. No.: 15/591,549

(22) Filed: May 10, 2017

(51) Int. Cl.
G06F 17/00 (2006.01)
H04S 5/00 (2006.01)
H03G 3/30 (2006.01)

(52) U.S. Cl.
CPC ............ H04S 5/005 (2013.01); H03G 3/301 (2013.01); *H03G 2201/106* (2013.01); *H04S 2400/05* (2013.01); *H04S 2400/07* (2013.01)

(58) Field of Classification Search
CPC ......... H04L 2027/0067; H04L 25/0202; H04L 2027/004; H04L 27/0014; H04S 7/305; H04S 5/005
See application file for complete search history.

(56) References Cited

U.S. PATENT DOCUMENTS

| | | |
|---|---|---|
| 2,655,564 A | 10/1953 | Aage |
| 3,070,669 A | 12/1962 | Franssen et al. |
| 3,272,906 A | 9/1966 | De Vries et al. |
| 3,987,256 A | 10/1976 | Nagamura |
| 4,027,101 A | 5/1977 | DeFreitas et al. |
| 4,039,755 A | 8/1977 | Berkovitz |
| 4,048,442 A | 9/1977 | Mannila et al. |
| 4,049,912 A | 9/1977 | Mitchell |
| 4,053,711 A | 10/1977 | DeFreitas et al. |
| 4,105,864 A | 8/1978 | Berkovitz |
| 4,251,688 A | 2/1981 | Furner |
| 4,332,979 A | 6/1982 | Fischer |
| 4,524,451 A | 6/1985 | Watanabe |
| 4,574,391 A | 3/1986 | Morishima |
| 4,594,729 A | 6/1986 | Weingartner |

(Continued)

FOREIGN PATENT DOCUMENTS

| | | |
|---|---|---|
| WO | 2012/163445 | 12/2012 |
| WO | 2016/130500 | 8/2016 |

*Primary Examiner* — Fan Tsang
*Assistant Examiner* — Eugene Zhao
(74) *Attorney, Agent, or Firm* — Renner, Otto, Boisselle & Sklar, LLP

(57) ABSTRACT

Extracting a common signal from multiple audio signals may include summing a first signal and a second signal to obtain a first+second signal; subtracting the second signal from the first signal to obtain a first−second signal; transforming the first+second signal and the first−second signal to frequency domain representations; calculating absolute value of the frequency domain representations of the first+second signal and the first−second signal; subtracting the absolute value of the frequency domain representation of the first−second signal from the absolute value of the frequency domain representation of the first+second signal to obtain a difference signal; multiplying the difference signal by the frequency domain representation of the first+second signal to obtain a product signal; dividing the product signal by the absolute value of the frequency domain representation of the first+second signal to obtain a frequency domain representation of the common signal; and transforming the frequency domain representation to the common signal.

20 Claims, 5 Drawing Sheets

(56) References Cited

U.S. PATENT DOCUMENTS

| | | |
|---|---|---|
| 4,856,064 A | 8/1989 | Iwamatsu |
| 4,941,177 A | 7/1990 | Mandell et al. |
| 5,068,897 A | 11/1991 | Yamato et al. |
| 5,119,422 A | 6/1992 | Price |
| 5,121,433 A | 6/1992 | Kendall et al. |
| 5,193,118 A | 3/1993 | Latham-Brown et al. |
| 5,235,646 A | 8/1993 | Wilde et al. |
| 5,255,370 A | 10/1993 | Sako et al. |
| 5,261,005 A | 11/1993 | Masayuki |
| 5,263,087 A | 11/1993 | Fosgate |
| 5,280,528 A | 1/1994 | Fosgate |
| 5,386,473 A | 1/1995 | Harrison |
| 5,414,774 A | 5/1995 | Yumoto |
| 5,428,687 A | 6/1995 | Willcocks et al. |
| 5,594,800 A | 1/1997 | Gerzon |
| 5,644,640 A | 7/1997 | Fosgate |
| 5,666,424 A | 9/1997 | Fosgate et al. |
| 5,796,844 A | 8/1998 | Griesinger |
| 5,812,674 A | 9/1998 | Jot et al. |
| 5,854,847 A | 12/1998 | Yoshida |
| 6,072,878 A | 6/2000 | Moorer |
| 6,252,965 B1 | 6/2001 | Beard |
| 6,405,163 B1 | 6/2002 | LaRoche |
| 6,684,060 B1 | 1/2004 | Curtin |
| 6,804,565 B2 | 10/2004 | Eid |
| 6,829,018 B2 | 12/2004 | Lin et al. |
| 6,836,295 B1 | 12/2004 | Cooper |
| 6,920,233 B2 | 7/2005 | Wolfson et al. |
| 7,243,073 B2 | 7/2007 | Yeh et al. |
| 7,257,231 B1 | 8/2007 | Avendano et al. |
| 7,292,901 B2 | 11/2007 | Baumgarte et al. |
| 7,330,552 B1 | 2/2008 | Lamance |
| 7,353,169 B1 * | 4/2008 | Goodwin ............ G10L 19/025 704/224 |
| 7,394,903 B2 | 7/2008 | Herre et al. |
| 7,412,380 B1 | 8/2008 | Avendano et al. |
| 7,542,815 B1 | 6/2009 | Berchin et al. |
| 7,567,845 B1 | 7/2009 | Avendano et al. |
| 7,606,373 B2 | 10/2009 | Moorer |
| 7,644,003 B2 | 1/2010 | Baumgarte et al. |
| 7,650,000 B2 | 1/2010 | Kawana et al. |
| 7,693,721 B2 | 4/2010 | Baumgarte et al. |
| 7,710,499 B2 | 5/2010 | Cooper |
| 7,760,890 B2 | 7/2010 | Furge et al. |
| 7,769,178 B2 | 8/2010 | Beard |
| 7,769,179 B2 | 8/2010 | Beard |
| 7,769,180 B2 | 8/2010 | Beard |
| 7,769,181 B2 | 8/2010 | Beard |
| 7,773,756 B2 | 8/2010 | Beard |
| 7,773,757 B2 | 8/2010 | Beard |
| 7,773,758 B2 | 8/2010 | Beard |
| 7,783,052 B2 | 8/2010 | Beard |
| 7,792,304 B2 | 9/2010 | Beard |
| 7,792,305 B2 | 9/2010 | Beard |
| 7,792,306 B2 | 9/2010 | Beard |
| 7,792,307 B2 | 9/2010 | Beard |
| 7,792,308 B2 | 9/2010 | Beard |
| 7,796,765 B2 | 9/2010 | Beard |
| 7,856,110 B2 | 12/2010 | Fujita et al. |
| 7,864,964 B2 | 1/2011 | Beard |
| 7,864,965 B2 | 1/2011 | Beard |
| 7,864,966 B2 | 1/2011 | Beard |
| 7,873,171 B2 | 1/2011 | Beard |
| 7,876,905 B2 | 1/2011 | Beard |
| 7,965,849 B2 | 6/2011 | Beard |
| 7,983,424 B2 | 7/2011 | Kjorling et al. |
| 7,986,796 B2 | 7/2011 | Kim et al. |
| 8,014,535 B2 | 9/2011 | Beard |
| 8,015,368 B2 | 9/2011 | Sharma et al. |
| 8,019,093 B2 | 9/2011 | Avendano et al. |
| 8,027,480 B2 | 9/2011 | Beard |
| 8,031,879 B2 | 10/2011 | Eid et al. |
| 8,041,043 B2 | 10/2011 | Faller |
| 8,054,980 B2 | 11/2011 | Wu et al. |
| 8,099,293 B2 | 1/2012 | Kulkarni |
| 8,108,220 B2 | 1/2012 | Saunders et al. |
| 8,116,479 B2 | 2/2012 | Hamada et al. |
| 8,126,172 B2 | 2/2012 | Horbach et al. |
| 8,159,610 B2 | 4/2012 | Cooper |
| 8,194,860 B2 | 6/2012 | Sugawara |
| 8,200,500 B2 | 6/2012 | Baumgarte et al. |
| 8,204,237 B2 | 6/2012 | Goodwin |
| 8,280,077 B2 | 10/2012 | Avendano et al. |
| 8,280,743 B2 | 10/2012 | Seefeldt et al. |
| 8,290,167 B2 | 10/2012 | Pulkki et al. |
| 8,295,496 B2 | 10/2012 | Kulkarni et al. |
| 8,300,833 B2 | 10/2012 | Beard |
| 8,379,868 B2 | 2/2013 | Goodwin et al. |
| 8,472,638 B2 | 6/2013 | Furge et al. |
| 8,520,862 B2 | 8/2013 | Scholz |
| 8,589,634 B2 | 11/2013 | Sharma et al. |
| 8,611,550 B2 | 12/2013 | Del Galdo et al. |
| 8,619,998 B2 | 12/2013 | Walsh et al. |
| 8,670,850 B2 | 3/2014 | Soulodre |
| 8,675,881 B2 | 3/2014 | Hultz et al. |
| 8,705,779 B2 | 4/2014 | Lee |
| 8,731,209 B2 | 5/2014 | Uhle et al. |
| 8,744,247 B2 | 6/2014 | Crockett et al. |
| 8,767,969 B1 | 7/2014 | Laroche et al. |
| 8,774,417 B1 | 7/2014 | Cabot et al. |
| 8,787,585 B2 | 7/2014 | Brown |
| 8,831,931 B2 | 9/2014 | Kuntz et al. |
| 8,908,873 B2 | 12/2014 | Herre et al. |
| 9,055,381 B2 | 6/2015 | Kirkeby et al. |
| 9,071,723 B2 | 6/2015 | Cooper |
| 9,082,395 B2 | 7/2015 | Heiko et al. |
| 9,084,068 B2 | 7/2015 | Abrahamsson et al. |
| 9,094,771 B2 | 7/2015 | Tsingos et al. |
| 9,100,767 B2 | 8/2015 | Van Baelen et al. |
| 9,161,149 B2 | 10/2015 | Visser et al. |
| 9,179,236 B2 | 11/2015 | Robinson et al. |
| 9,183,839 B2 | 11/2015 | Faller |
| 9,233,308 B2 | 1/2016 | Kuo et al. |
| 9,271,102 B2 | 2/2016 | Kulavik et al. |
| 9,344,825 B2 | 5/2016 | Carroll |
| 9,357,325 B2 | 5/2016 | Lee et al. |
| 9,368,122 B2 | 6/2016 | Kuntz et al. |
| 9,369,164 B2 | 6/2016 | Kim et al. |
| 9,408,010 B2 | 8/2016 | Harma et al. |
| 9,443,524 B2 | 9/2016 | Wu et al. |
| 9,462,384 B2 | 10/2016 | Lakkundi et al. |
| 9,462,405 B2 | 10/2016 | Lee |
| 9,478,228 B2 | 10/2016 | Oomen et al. |
| 9,485,601 B1 | 11/2016 | Cabot et al. |
| 9,503,816 B2 | 11/2016 | Iseki et al. |
| 9,549,276 B2 | 1/2017 | Chon et al. |
| 9,578,437 B2 | 2/2017 | Oh et al. |
| 9,583,113 B2 | 2/2017 | Kapinos |
| 9,628,934 B2 | 4/2017 | Davis |
| 2003/0039365 A1 | 2/2003 | Eid et al. |
| 2003/0039366 A1 | 2/2003 | Eid et al. |
| 2003/0040822 A1 | 2/2003 | Eid et al. |
| 2003/0223589 A1 | 12/2003 | Wang |
| 2003/0235317 A1 | 12/2003 | Baumgarte |
| 2003/0236583 A1 | 12/2003 | Baumgarte et al. |
| 2004/0008847 A1 | 1/2004 | Kim et al. |
| 2004/0062401 A1 | 4/2004 | Davis |
| 2004/0212320 A1 | 10/2004 | Dowling et al. |
| 2005/0012860 A1 | 1/2005 | Cooper |
| 2005/0018860 A1 | 1/2005 | Furge et al. |
| 2005/0063551 A1 | 3/2005 | Cheng et al. |
| 2005/0141724 A1 | 6/2005 | Hesdahl |
| 2005/0141728 A1 | 6/2005 | Moorer |
| 2005/0152556 A1 | 7/2005 | Brett |
| 2005/0165502 A1 | 7/2005 | Hanes |
| 2005/0271215 A1 | 12/2005 | Kulkarni |
| 2005/0276420 A1 | 12/2005 | Davis |
| 2006/0088168 A1 | 4/2006 | Beard |
| 2006/0088175 A1 | 4/2006 | Eid et al. |
| 2006/0115100 A1 | 6/2006 | Faller |
| 2006/0198528 A1 | 9/2006 | Tuffy et al. |
| 2006/0256969 A1 | 11/2006 | Takashima et al. |
| 2006/0262939 A1 | 11/2006 | Buchner et al. |
| 2007/0047736 A1 | 3/2007 | Shioda |

(56) References Cited

U.S. PATENT DOCUMENTS

| | | |
|---|---|---|
| 2007/0135952 A1 | 6/2007 | Chubarev |
| 2007/0140497 A1 | 6/2007 | Moon et al. |
| 2007/0140498 A1 | 6/2007 | Moon et al. |
| 2007/0183601 A1 | 8/2007 | Van Loon et al. |
| 2007/0206800 A1 | 9/2007 | Beard |
| 2007/0206801 A1 | 9/2007 | Beard |
| 2007/0206802 A1 | 9/2007 | Beard |
| 2007/0206803 A1 | 9/2007 | Beard |
| 2007/0206804 A1 | 9/2007 | Beard |
| 2007/0206805 A1 | 9/2007 | Beard |
| 2007/0206806 A1 | 9/2007 | Beard |
| 2007/0206807 A1 | 9/2007 | Beard |
| 2007/0206808 A1 | 9/2007 | Beard |
| 2007/0206809 A1 | 9/2007 | Beard |
| 2007/0206810 A1 | 9/2007 | Beard |
| 2007/0206811 A1 | 9/2007 | Beard |
| 2007/0206812 A1 | 9/2007 | Beard |
| 2007/0206813 A1 | 9/2007 | Beard |
| 2007/0206814 A1 | 9/2007 | Beard |
| 2007/0206815 A1 | 9/2007 | Beard |
| 2007/0206816 A1 | 9/2007 | Beard |
| 2007/0206821 A1 | 9/2007 | Beard |
| 2007/0211905 A1 | 9/2007 | Beard |
| 2007/0233293 A1 | 10/2007 | Villemoes et al. |
| 2007/0263877 A1 | 11/2007 | Beard |
| 2007/0269063 A1 | 11/2007 | Goodwin et al. |
| 2008/0025534 A1 | 1/2008 | Kuhn et al. |
| 2008/0031462 A1 | 2/2008 | Walsh et al. |
| 2008/0059160 A1 | 3/2008 | Saunders et al. |
| 2008/0069366 A1 | 3/2008 | Soulodre |
| 2008/0091436 A1 | 4/2008 | Breebaart et al. |
| 2008/0091439 A1 | 4/2008 | Baumgarte et al. |
| 2008/0152155 A1 | 6/2008 | Avendano et al. |
| 2008/0159571 A1 | 7/2008 | Hooley |
| 2008/0175394 A1 | 7/2008 | Goodwin |
| 2008/0232603 A1 | 9/2008 | Soulodre et al. |
| 2008/0232616 A1 | 9/2008 | Pulkki et al. |
| 2008/0263285 A1 | 10/2008 | Sharma et al. |
| 2008/0294444 A1 | 11/2008 | Oh et al. |
| 2008/0298612 A1 | 12/2008 | Kulkarni |
| 2008/0304671 A1 | 12/2008 | Kulkarni |
| 2008/0317257 A1 | 12/2008 | Furge et al. |
| 2008/0319564 A1 | 12/2008 | Furge et al. |
| 2009/0092259 A1 | 4/2009 | Jot et al. |
| 2009/0110204 A1 | 4/2009 | Walsh et al. |
| 2009/0129603 A1 | 5/2009 | Cho |
| 2009/0180625 A1 | 7/2009 | Bai et al. |
| 2009/0198356 A1 | 8/2009 | Goodwin et al. |
| 2009/0225991 A1 | 9/2009 | Oh et al. |
| 2009/0287328 A1 | 11/2009 | Berchin |
| 2009/0319281 A1 | 12/2009 | Baumgarte et al. |
| 2010/0030563 A1 | 2/2010 | Uhle et al. |
| 2010/0061558 A1 | 3/2010 | Faller |
| 2010/0215199 A1 | 8/2010 | Breebaart |
| 2010/0246833 A1 | 9/2010 | Hagiwara et al. |
| 2010/0296672 A1 | 11/2010 | Vickers |
| 2011/0002488 A1 | 1/2011 | Van Daele et al. |
| 2011/0026720 A1 | 2/2011 | Ohta |
| 2011/0081024 A1 | 4/2011 | Soulodre |
| 2011/0129091 A1 | 6/2011 | Kron |
| 2011/0137662 A1 | 6/2011 | McGrath et al. |
| 2011/0150228 A1 | 6/2011 | Yoon et al. |
| 2011/0164855 A1 | 7/2011 | Crockett et al. |
| 2011/0200195 A1 | 8/2011 | Lau et al. |
| 2012/0016502 A1 | 1/2012 | Sharma et al. |
| 2012/0039477 A1 | 2/2012 | Schijers et al. |
| 2012/0045065 A1 | 2/2012 | Ishihara |
| 2012/0059498 A1 | 3/2012 | Berchin |
| 2012/0063608 A1 | 3/2012 | Soulodre |
| 2012/0070006 A1 | 3/2012 | Berchin |
| 2012/0099739 A1 | 4/2012 | Hultz et al. |
| 2012/0127365 A1 | 5/2012 | Cooper |
| 2012/0128160 A1 | 5/2012 | Kim et al. |
| 2012/0155650 A1 | 6/2012 | Horbach |
| 2012/0195434 A1 | 8/2012 | Herre et al. |
| 2012/0207309 A1 | 8/2012 | Eppolito |
| 2012/0266067 A1 | 10/2012 | Armstrong et al. |
| 2012/0275613 A1 | 11/2012 | Soulodre |
| 2012/0300946 A1 | 11/2012 | Ma |
| 2012/0307048 A1 | 12/2012 | Abrahamsson et al. |
| 2012/0328109 A1 | 12/2012 | Harma et al. |
| 2012/0328136 A1 | 12/2012 | Chiang |
| 2013/0021502 A1 | 1/2013 | Oku et al. |
| 2013/0070927 A1 | 3/2013 | Harma |
| 2013/0108057 A1 | 5/2013 | Yuyama et al. |
| 2013/0142338 A1 | 6/2013 | Chang et al. |
| 2013/0144922 A1 | 6/2013 | Par |
| 2013/0173273 A1 | 7/2013 | Kuntz et al. |
| 2013/0208895 A1* | 8/2013 | Horbach ............... H04S 5/005 381/17 |
| 2013/0251156 A1 | 9/2013 | Katayama |
| 2013/0315402 A1 | 11/2013 | Visser et al. |
| 2013/0322633 A1 | 12/2013 | Stone et al. |
| 2014/0010375 A1 | 1/2014 | Usher et al. |
| 2014/0023094 A1* | 1/2014 | Chen ................. H04L 25/0202 370/503 |
| 2014/0072124 A1 | 3/2014 | Stoecklmeier et al. |
| 2014/0072126 A1 | 3/2014 | Uhle et al. |
| 2014/0086437 A1 | 3/2014 | Koh et al. |
| 2014/0119545 A1 | 5/2014 | Uhle et al. |
| 2014/0153744 A1 | 6/2014 | Brannmark et al. |
| 2014/0185812 A1 | 7/2014 | Van Achte et al. |
| 2014/0205100 A1 | 7/2014 | Faller et al. |
| 2014/0233762 A1 | 8/2014 | Vilkamo et al. |
| 2014/0270182 A1 | 9/2014 | Vilermo et al. |
| 2014/0270281 A1 | 9/2014 | Walsh et al. |
| 2014/0270721 A1 | 9/2014 | Crockett et al. |
| 2014/0282706 A1 | 9/2014 | Kim et al. |
| 2014/0336800 A1 | 11/2014 | Radhakrishnan et al. |
| 2014/0341404 A1 | 11/2014 | Choisel et al. |
| 2014/0355769 A1 | 12/2014 | Peters et al. |
| 2014/0355770 A1 | 12/2014 | Peters et al. |
| 2014/0355771 A1 | 12/2014 | Peters et al. |
| 2014/0358266 A1 | 12/2014 | Peters et al. |
| 2014/0358558 A1 | 12/2014 | Sen et al. |
| 2014/0358559 A1 | 12/2014 | Sen et al. |
| 2014/0358560 A1 | 12/2014 | Sen et al. |
| 2014/0358561 A1 | 12/2014 | Sen et al. |
| 2014/0358562 A1 | 12/2014 | Sen et al. |
| 2014/0358563 A1 | 12/2014 | Sen et al. |
| 2014/0358564 A1 | 12/2014 | Sen et al. |
| 2014/0358565 A1 | 12/2014 | Peters et al. |
| 2014/0358567 A1 | 12/2014 | Koppens et al. |
| 2014/0373044 A1 | 12/2014 | Carrol et al. |
| 2015/0003616 A1 | 1/2015 | Middlemiss et al. |
| 2015/0036829 A1 | 2/2015 | Meier |
| 2015/0036849 A1 | 2/2015 | Thompson |
| 2015/0042880 A1 | 2/2015 | Cooper |
| 2015/0063610 A1 | 3/2015 | Mossner |
| 2015/0092965 A1 | 4/2015 | Umminger et al. |
| 2015/0098597 A1 | 4/2015 | Kulavik |
| 2015/0106475 A1 | 4/2015 | Tan et al. |
| 2015/0110275 A1 | 4/2015 | Tammi et al. |
| 2015/0131826 A1 | 5/2015 | Bahne et al. |
| 2015/0156599 A1 | 6/2015 | Romigh |
| 2015/0172843 A1 | 6/2015 | Quan |
| 2015/0179180 A1 | 6/2015 | Oh et al. |
| 2015/0213807 A1 | 7/2015 | Breebaart et al. |
| 2015/0215721 A1 | 7/2015 | Sato et al. |
| 2015/0243289 A1 | 8/2015 | Radhakrishnan et al. |
| 2015/0249899 A1 | 9/2015 | Kuech et al. |
| 2015/0264502 A1 | 9/2015 | Aoki et al. |
| 2015/0269948 A1 | 9/2015 | Purnhagen et al. |
| 2015/0271620 A1 | 9/2015 | Lando et al. |
| 2015/0277847 A1 | 10/2015 | Yliaho et al. |
| 2015/0312692 A1 | 10/2015 | Esslinger |
| 2015/0326988 A1 | 11/2015 | Zielinsky |
| 2015/0332681 A1 | 11/2015 | Kim et al. |
| 2015/0334500 A1 | 11/2015 | Mieth et al. |
| 2015/0340043 A1 | 11/2015 | Koppens et al. |
| 2015/0350801 A1 | 12/2015 | Koppens et al. |
| 2015/0350802 A1 | 12/2015 | Jo et al. |
| 2015/0350804 A1 | 12/2015 | Crockett et al. |
| 2015/0356976 A1 | 12/2015 | Herre et al. |

(56) References Cited

U.S. PATENT DOCUMENTS

| | | |
|---|---|---|
| 2015/0358754 A1 | 12/2015 | Koppens et al. |
| 2015/0358756 A1 | 12/2015 | Harma et al. |
| 2015/0371644 A1 | 12/2015 | Par |
| 2015/0382128 A1 | 12/2015 | Ridihalgh et al. |
| 2016/0005408 A1 | 1/2016 | Visser et al. |
| 2016/0007133 A1 | 1/2016 | Mateos et al. |
| 2016/0021476 A1 | 1/2016 | Robinson et al. |
| 2016/0021477 A1 | 1/2016 | Hiipakka et al. |
| 2016/0037283 A1 | 2/2016 | Uhle et al. |
| 2016/0073213 A1 | 3/2016 | Yamamoto et al. |
| 2016/0073215 A1 | 3/2016 | De Bruijn et al. |
| 2016/0080883 A1 | 3/2016 | Yamamoto et al. |
| 2016/0080884 A1 | 3/2016 | Song et al. |
| 2016/0080886 A1 | 3/2016 | De Bruijn et al. |
| 2016/0100253 A1 | 4/2016 | Yliaho et al. |
| 2016/0100270 A1 | 4/2016 | Araki |
| 2016/0112819 A1 | 4/2016 | Mehnert et al. |
| 2016/0127847 A1 | 5/2016 | Shi et al. |
| 2016/0127849 A1 | 5/2016 | Suyama et al. |
| 2016/0133260 A1 | 5/2016 | Hatanaka et al. |
| 2016/0133261 A1 | 5/2016 | Shi et al. |
| 2016/0133263 A1 | 5/2016 | Borss et al. |
| 2016/0142850 A1 | 5/2016 | Borss et al. |
| 2016/0150343 A1 | 5/2016 | Wang et al. |
| 2016/0157040 A1 | 6/2016 | Ertel et al. |
| 2016/0165374 A1 | 6/2016 | Shi et al. |
| 2016/0192102 A1 | 6/2016 | Estrada et al. |
| 2016/0225377 A1 | 8/2016 | Miyasaka et al. |
| 2016/0241982 A1 | 8/2016 | Seefeldt et al. |
| 2016/0247514 A1 | 8/2016 | Villemoes et al. |
| 2016/0255454 A1 | 9/2016 | McGrath et al. |
| 2016/0269847 A1 | 9/2016 | Par |
| 2016/0286331 A1 | 9/2016 | Murayama et al. |
| 2016/0302021 A1 | 10/2016 | Kim et al. |
| 2016/0309276 A1 | 10/2016 | Ridihalgh et al. |
| 2016/0316109 A1 | 10/2016 | Cooper |
| 2016/0330560 A1 | 11/2016 | Chon et al. |
| 2016/0336014 A1 | 11/2016 | Brockmole et al. |
| 2016/0366530 A1 | 12/2016 | Peters et al. |
| 2016/0381482 A1 | 12/2016 | Peters et al. |
| 2016/0381483 A1 | 12/2016 | Robinson et al. |
| 2017/0024185 A1 | 1/2017 | Lakkundi et al. |
| 2017/0026751 A1 | 1/2017 | Suzuki et al. |
| 2017/0026768 A1 | 1/2017 | Kron |
| 2017/0055096 A1 | 2/2017 | Chamness et al. |
| 2017/0064484 A1 | 3/2017 | Borss et al. |
| 2017/0070838 A1 | 3/2017 | Helwani et al. |
| 2017/0078818 A1 | 3/2017 | Habets et al. |
| 2017/0078819 A1 | 3/2017 | Habets et al. |
| 2017/0094438 A1 | 3/2017 | Chon et al. |
| 2017/0099546 A1 | 4/2017 | Spitznagle et al. |
| 2017/0099558 A1 | 4/2017 | Spitznagle et al. |

\* cited by examiner

EXTRACTING A COMMON SIGNAL FROM MULTIPLE AUDIO SIGNALS

BACKGROUND

Surround audio systems used in movie theatres and home cinema systems use multiple speakers to simulate a sound field surrounding the listener. Surround audio greatly enhances the listener's experience. Currently, one of the most popular surround audio configurations is the well-known surround 5.1 configuration which uses five full bandwidth channels and a low frequency effect (LFE) channel. The most popular format for storing high quality music, however, remains two-channel stereo, not surround. Therefore, for the most part, high quality music cannot be enjoyed in surround.

Upmixing processes may be applied to audio signals to derive additional audio channels, for example, to go from two-channel stereo to surround 5.1. Existing upmixing methods create an allusion of surround sound through the use of matrixing, phasing, time delay, and reverberation effects added to the stereo mix as a way to generate surround. While these conventional systems and methods create an effect, they also produce unnatural-sounding artifacts that may cause music to sound fake, hollow, or annoying to the listener. The listener may experience a loss of overall clarity or quality as if "something just does not sound correct" with the sound. There may be little or no distinction to the segments in the conventional upmixed surround presentation. These issues diminish the listener's experience.

Another area in which sonic artifacts negatively affect the listener's experience is peak limiting. Peak limiters have become ubiquitous in music production. With the advent of digital processing, peak limiters can react instantaneously to or even in advance of audio peaks, ensuring that the signal never gets louder than a predetermined ceiling. Conventional peak limiters, however, come at the cost of clarity and punch, and added spectral artifacts. Thus, conventional peak limiters may do a good job at limiting peaks but they add harmonic spectra that disturbs the sound. These issues also diminish the listener's experience.

SUMMARY

The present disclosure describes novel techniques for extracting a common signal from multiple audio signals and for using the extracted common signal to improve the surround effect or the peak limited sound the listener hears, thereby improving the user experience.

The techniques disclosed herein include an audio signal processing technique that extracts a common signal from those embedded in a stereophonic signal. This technique is used to convert the stereophonic audio (i.e., a two channel signal) into multiple channels of surround sound. A key resulting feature of the techniques disclosed is significantly improved distinction in the sound field. The techniques isolate and place audio segments into proper sound field locations. Importantly, the techniques accomplish this without adding any fake or false signal cues, such as time delay, reverb, or ancillary unnatural effects to generate the surround sound experience.

These new techniques have the ability to isolate all of the spatial sonic cues in the stereo audio and then place each of these cues (segments) into the appropriate location of the surround field. This is done without any of the aforementioned unnatural artifacts. The result is an experience that appears rich, musical, natural, and as if the performance is occurring all around the listener. A simple description might be "sound all around."

For example: The stereo mix of the song "Leaving On A Jet Plane," as performed by Peter, Paul, and Mary, was produced with the three performers mixed in the following manner: Peter Yarrow in the left channel, Mary Travers in the center (i.e., her vocals are equally distributed between both left and right channels to create a phantom or pseudo center channel), and Paul Stookey in the right channel. When this song is heard using this new technique, Mary is heard in the center channel, Peter is heard in the left-rear channel, and Paul is heard in the right-rear channel. There is true isolation and distinction to the sound field, and is presented in a natural and musical fashion.

The techniques disclosed here may find particular application in the field of consumer audio. For example, the techniques disclosed herein may be applied to enhance any existing stereo sound device: radio, television, CD player, iPod/iPhone, wireless home sound system, car audio, and many more.

A particularly good candidate for these techniques may be the automobile listening experience. Adding this techniques to the in-car sound system would enable natural sounding surround from any stereo signal. Conveniently, many cars already have the needed number of speakers installed to enable the experience.

Another potential application relates to a peak limiter where the limiting function generates added harmonic spectra. The techniques disclosed herein may be used to perform the desired peak limiting, yet eliminate the added undesirable spectral information.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Stereophonic audio offers two signal channels, left and right speaker channels. In stereo, audio cues are physically presented to the listener from the left and right side speakers. There is no physical center speaker. What appears as "centered" audio is actualized from an equal amount of the same content routed or panned to the left and right channels. This creates a phantom or pseudo center channel. Using a musical example, there may be a guitar located in the left channel, piano in the right channel, and an equal amount of a vocalist routed to both left and right channels. This configuration creates the illusion that the vocalist appears in the center, but there is no true center channel.

The techniques presented herein may receive the stereo left and right channel signals and yield sound stage cues which represent left, right, and center channels. A key part is isolating or extracting the center content. Once this is accomplished, the isolated center channel signal may be subtracted from the stereo left and right channel signals, and the result is isolated content for left, right, and center. The isolated left and right channel signals may respectively be used as rear-left and rear-right speaker signals. The front-left and front-right speaker signals may be a mixture of the original stereo cues attenuated by some amount. The extracted common signal may be routed to a physical center channel speaker. Low Frequency Extension (LFE) may be accomplished through the use of linearized filters designed to separate the bass frequencies. The resulting LFE speaker signal may be connected to a sub-woofer speaker. These six speaker signals yield the surround 5.1 sound stage.

Figure 1:
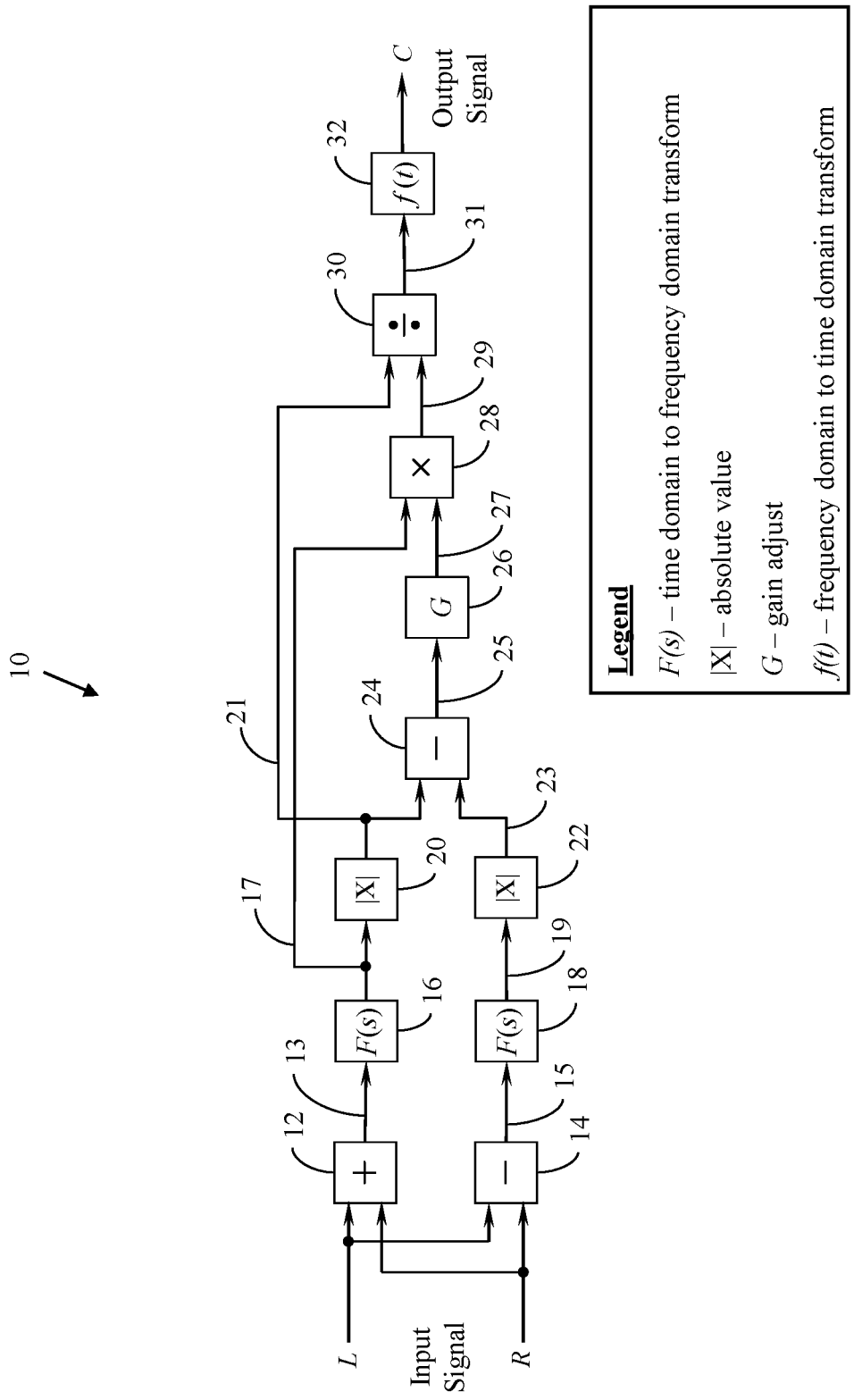
FIG. 1 illustrates a block diagram of an exemplary extractor for extracting a common signal from at least two audio signals.

FIG. 1 illustrates a block diagram of an exemplary extractor 10 for extracting a common signal from at least two audio signals. In the presence of multiple audio signals, which contain common and difference information, the extractor 10 extracts and isolates a common content signal C. In the example of FIG. 1 the extractor 10 extracts the common signal C from stereo left L and right R channel signals. The utility of the techniques disclosed herein to extract a common signal from at least two audio signals is not limited to the stereo example but include other context such as, as described in more detail below, eliminating undesired spectral information in peak limiting applications.

The extractor 10 includes a summer 12 that receives the L and R signals and sums them to obtain an L+R signal 13. The extractor 10 also includes a subtractor 14 that receives the L and R signals and subtract L from R to obtain an L−R signal 15. In the example of stereophonic (two channel) audio signals, common and difference information will be contained in the left and right channels. Adding and subtracting the two channels will yield sum and difference signals 13 and 15, thereby producing a monophonic mix of the stereo source L+R signal 13, and an isolation of the stereo sound field L−R signal 15, which represents content that resides in either the left or right channel.

The L+R and L−R signals 13 and 15 may then be converted from the time domain to the frequency domain through the use of the Fast Fourier Transform (FFT) or equivalent. To this end, the extractor 10 includes the FFT transformers 16 and 18, which transform the L+R and L−R signals 13 and 15 to their respective frequency domain representations 17 and 19.

The absolute value |X| of the frequency domain representation signals 17 and 19 is calculated, which yields the relative energy of each specified frequency bin within the FFT. To this end, the extractor 10 includes absolute value processors 20 and 22, which calculate and output the absolute value 21 of the frequency domain representation 17 of the L+R signal 13, and the absolute value 23 of the frequency domain representation 19 of the L−R signal 15.

The extractor 10 further includes subtractor 24 that subtracts the absolute value 23 of the frequency domain representation 19 of the L-R signal 15 from the absolute value 21 of the frequency domain representation 17 of the L+R signal 13 to obtain a difference signal 25. All uncommon detected spectra of the L+R and L-R signals is removed, allowing only detected spectra that is common to the original left and right channels to remain.

In the illustrated embodiment, the extractor 10 may also include gain adjustor or attenuator 26 which may adjust the gain of the difference signal 25. The gain adjustor 26 may adjust the gain of the difference signal 25 by, for example, −3.0 dB (0.707 attenuation).

This remaining detected spectra of the difference signal 25 (or of the gain adjusted difference signal 27) may then be applied to the frequency domain content 17 of the L+R signal. To this end, the extractor 10 may also include a multiplier 28 that multiplies the difference signal 25 or the gain adjusted difference signal 27 by the frequency domain representation 17 of the L+R signal 13 to obtain a product signal 29.

The extractor 10 may also include a divider 30 that divides the product signal 29 by the absolute value 21 of the frequency domain representation 17 of the L+R signal 13. In one embodiment, the divider 30 divides the product signal 29 by the absolute value 21 slightly adjusted upwards (e.g., +0.01, +0.001, or +0.0001) so that the absolute value 21 is higher than zero to avoid a division by zero. The divider 30 in essence normalizes the product signal 29 by dividing it by the absolute value 21 or by the absolute value 21 slightly adjusted upwards. The output 31 of the divider 30 corresponds to the frequency domain representation of the time domain common signal C.

The frequency domain representation 31 of the common signal C may then be passed through an Inverse Fast Fourier Transform (IFFT), which returns the common signal from the frequency domain back to the time domain. To this end, the extractor 10 includes a transformer 32 that transforms the frequency domain representation 31 to the common signal C.

Figure 2:
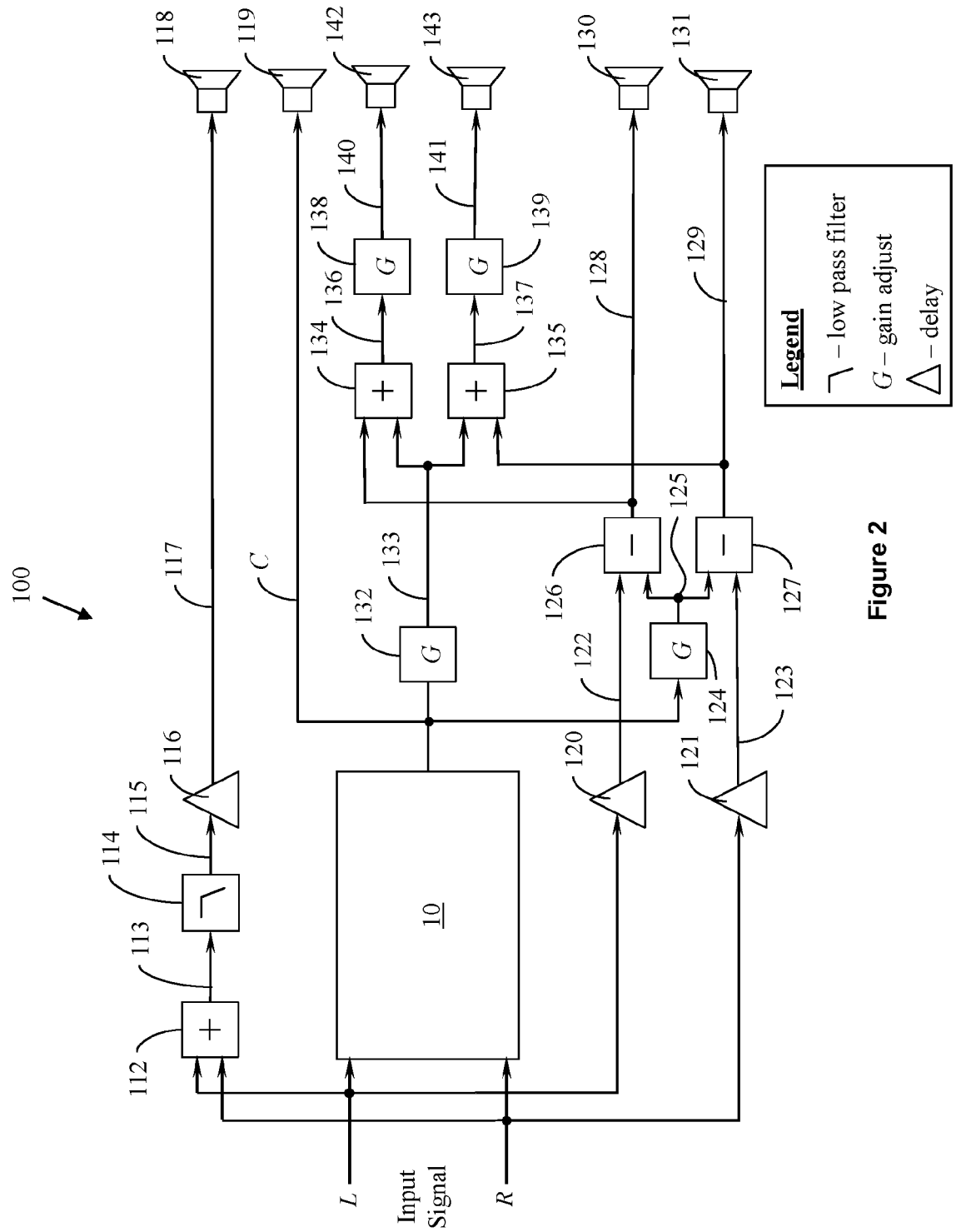
FIG. 2 illustrates a block diagram of an exemplary upmixer that may be applied to stereo audio signals to derive additional audio channels, from stereo to surround 5.1.

FIG. 2 illustrates a block diagram of an exemplary upmixer 100 that may be applied to the stereo audio signals L, R to derive additional audio channels, from stereo to surround 5.1. The upmixer 100 incorporates the novel extractor 10 for extracting a common signal C from multiple audio signals L, R. Once this is accomplished, the common signal C may be isolated content for center, the common signal C may be subtracted from the stereo left and right channel signals, and the result may be isolated content for left and right. The isolated left and right channel signals may respectively be used as rear-left and rear-right speaker signals. The front-left and front-right speaker signals may be a mixture of the original stereo cues attenuated by some amount.

Low Frequency Extension (LFE) may be accomplished through the use of linearized filters designed to separate the bass frequencies. To this end, the upmixer 100 may include a summer 112 that sums the L and R signals to obtain an L+R signal 113. The upmixer 100 may also include a low-pass filter 114 that passes the bass frequencies signal 115 and a delay 116 that delays the signal 115 to account for any delays in the extractor 10. The resulting LFE channel signal 117 may be connected to a sub-woofer speaker 118.

The extracted common signal C (or a real portion or absolute value of the extracted common signal C) may be routed to a physical center channel speaker 119.

To accomplish left-rear and right-rear the upmixer 100 may include delays 120 and 121 that delay the L and R signals, respectively, to account for delays in the extractor 10 and output delayed L and R signals, 122 and 123. The upmixer 100 may also include a gain adjustor or attenuator 124 to which the common signal C (or a real portion or absolute value of the extracted common signal C) may be applied to obtain attenuated common signal 125. In one embodiment, the common signal C (or a real portion or absolute value of the extracted common signal C) may be attenuated by, for example, −3.0 dB (0.707 attenuation). In one embodiment, the common signal C (or a real portion or absolute value of the extracted common signal C) is not attenuated. The upmixer 100 may also include subtractors 126 and 127. The subtractor 126 subtracts the signal 125 from the delayed L signal 122 to output the left-rear signal 128. The subtractor 127 subtracts the signal 125 from the delayed R signal 123 to output the right-rear signal 129. The left-rear signal 128 may be routed to a left-rear speaker 130 and the right-rear signal may be routed to a right-rear speaker 131.

To accomplish left-front and right-front the upmixer 100 may include a gain adjustor or attenuator 132 to which the common signal C (or a real portion or absolute value of the extracted common signal C) may be applied to obtain attenuated common signal 133. In one embodiment, the common signal C (or a real portion or absolute value of the extracted common signal C) may be attenuated by, for example, −6 dB (0.5 attenuation). In one embodiment, the common signal C (or a real portion or absolute value of the extracted common signal C) is not attenuated. The upmixer 100 may also include summers 134 and 135. The summer 134 sums the signal 133 to the left-rear signal 128 to obtain the signal 136. The summer 135 sums the signal 133 to the right-rear signal 129 to obtain the signal 137. The upmixer 100 may also include gain adjustors or attenuators 138 and 139. The signal 136 may be applied to the attenuator 138 to obtain the left-front signal 140. The signal 137 may be applied to the attenuator 139 to obtain the right-front signal 141. In one embodiment, the signals 136 and 137 may be attenuated by, for example, −6 dB (0.5 attenuation). In one embodiment, the signals 136 and 137 are not attenuated. The left-front signal 140 may be routed to a left-front speaker 142 and the right-front signal may be routed to a right-front speaker 143.

The upmixer 100 isolates all of the spatial sonic cues in the stereo audio and then places these cues (segments) into the appropriate location of the surround field, significantly improving distinction in the sound field. Importantly, the techniques accomplish this without adding any fake or false signal cues, such as time delay, reverb, or ancillary unnatural effects to generate the surround sound experience. The result is an experience that appears rich, musical, natural, and as if the performance is occurring all around the listener. A simple description might be "sound all around."

Figure 3:
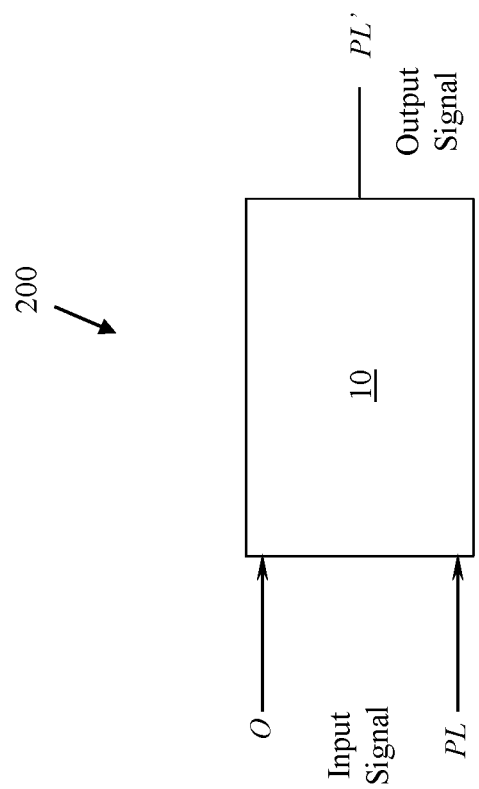
FIG. 3 illustrates a block diagram of an exemplary peak limiter cleanser.

FIG. 3 illustrates a block diagram of an exemplary peak limiter cleanser 200. Peak limiters have become ubiquitous in music production. With the advent of digital processing, peak limiters can react instantaneously to or even in advance of audio peaks, ensuring that the signal never gets louder than a predetermined ceiling. Conventional peak limiters, however, come at the cost of clarity and punch, and some added spectral artifacts. Thus, conventional peak limiters may do a good job at limiting peaks but they add harmonic spectra that disturbs the sound. The peak limiter cleanser 200 addresses this problem.

The peak limiter cleanser 200 receives the original audio signal O and a peak limited version PL of the original audio signal. The signal PL has been peak limited using a conventional peak limiter. The peak limiter cleanser 200 incorporates the novel extractor 10 for extracting a common signal C from the original audio signal O and the peak limited version PL of the original audio signal to output a cleansed peak limited signal PL'. The signal PL' represents a second peak-limited version of the original signal O but without at least some of the undesirable spectral information produced by conventional peak limiters. The signal PL' provides significant improvements in clarity and punch because it does not include the undesirable spectral artifacts, thereby producing much more pleasant sound.

Example methods may be better appreciated with reference to flow diagrams.

Figure 4:
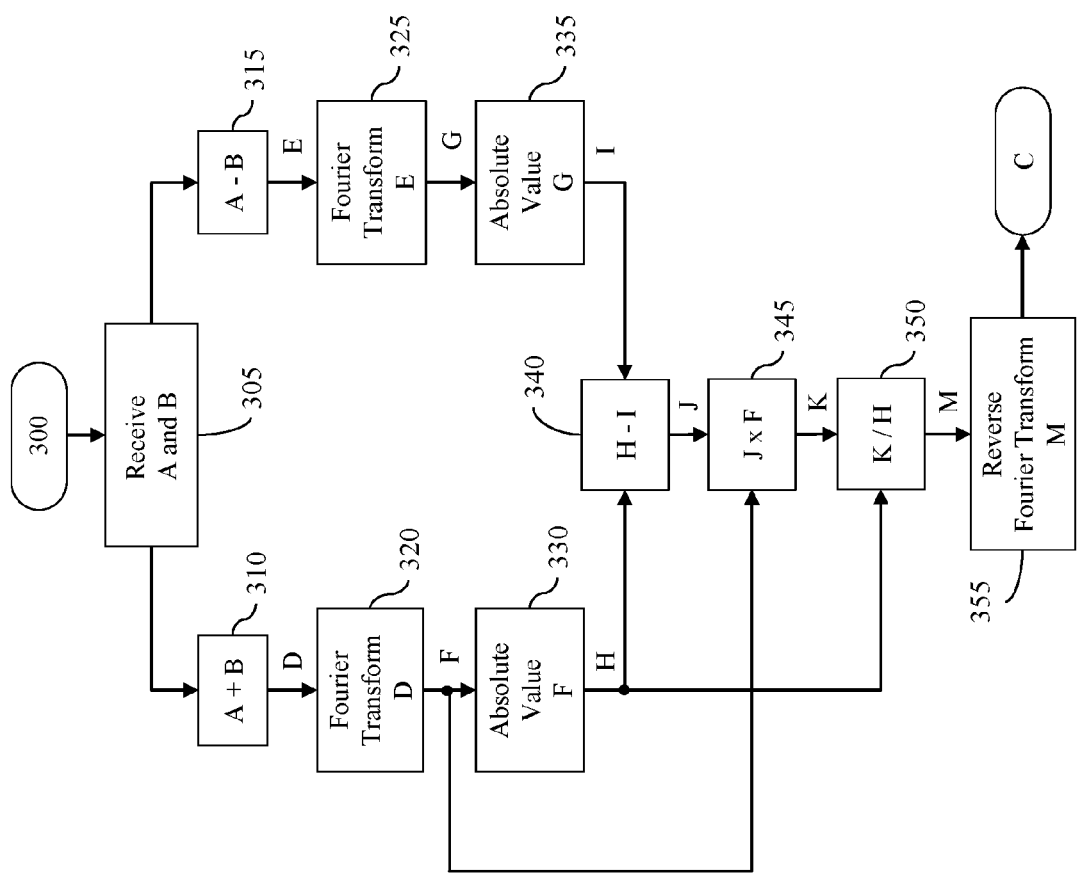
FIG. 4 illustrates a flow diagram for an exemplary method for extracting a common signal from at least two audio signals.

FIG. 4 illustrates a flow diagram for an exemplary method 300 for extracting a common signal C from at least two audio signals, A and B. At 305, the method 300 includes receiving the two audio signals A and B. At 310, the method 300 includes summing the first signal A and the second signal B to obtain D. At 315, the method 300 includes subtracting the second signal B from the first signal A to obtain E.

At 320, the method 300 includes transforming the D signal to a frequency domain representation F. At 325, the method 300 includes transforming the E signal to a frequency domain representation G. At 330, the method 300 includes calculating absolute value of the frequency domain representation F to obtain H. At 335, the method 300 includes calculating absolute value of the frequency domain representation G to obtain I.

At 340, the method 300 includes subtracting the absolute value I from the absolute value H to obtain a difference signal J. At 345, the method 300 includes multiplying the difference signal J (or the difference signal J with its gain adjusted) by the frequency domain representation F to obtain a product signal K. At 350, the method 300 includes dividing the product signal K by the absolute value H (or by the absolute value H adjusted upwards) to obtain a frequency domain representation M of the common signal C.

At 355, the method 300 includes transforming the frequency domain representation M to the time domain common signal C.

While FIG. 4 illustrates various actions occurring in serial, it is to be appreciated that various actions illustrated could occur substantially in parallel, and while actions may be shown occurring in parallel, it is to be appreciated that these actions could occur substantially in series. While a number of processes are described in relation to the illustrated methods, it is to be appreciated that a greater or lesser number of processes could be employed and that lightweight processes, regular processes, threads, and other approaches could be employed. It is to be appreciated that other example methods may, in some cases, also include actions that occur substantially in parallel. The illustrated exemplary methods and other embodiments may operate in real-time, faster than real-time in a software or hardware or hybrid software/hardware implementation, or slower than real time in a software or hardware or hybrid software/hardware implementation.

While for purposes of simplicity of explanation, the illustrated methodologies are shown and described as a series of blocks, it is to be appreciated that the methodologies are not limited by the order of the blocks, as some blocks can occur in different orders or concurrently with other blocks from that shown and described. Moreover, less than all the illustrated blocks may be required to implement an example methodology. Furthermore, additional methodologies, alternative methodologies, or both can employ additional blocks, not illustrated.

In the flow diagram, blocks denote "processing blocks" that may be implemented with logic. The processing blocks may represent a method step or an apparatus element for performing the method step. The flow diagrams do not depict syntax for any particular programming language, methodology, or style (e.g., procedural, object-oriented). Rather, the flow diagram illustrates functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown or that blocks may be combined or separated into multiple components. It will be appreciated that the processes may be implemented using various programming approaches like machine language, procedural, object oriented or artificial intelligence techniques.

Figure 5:
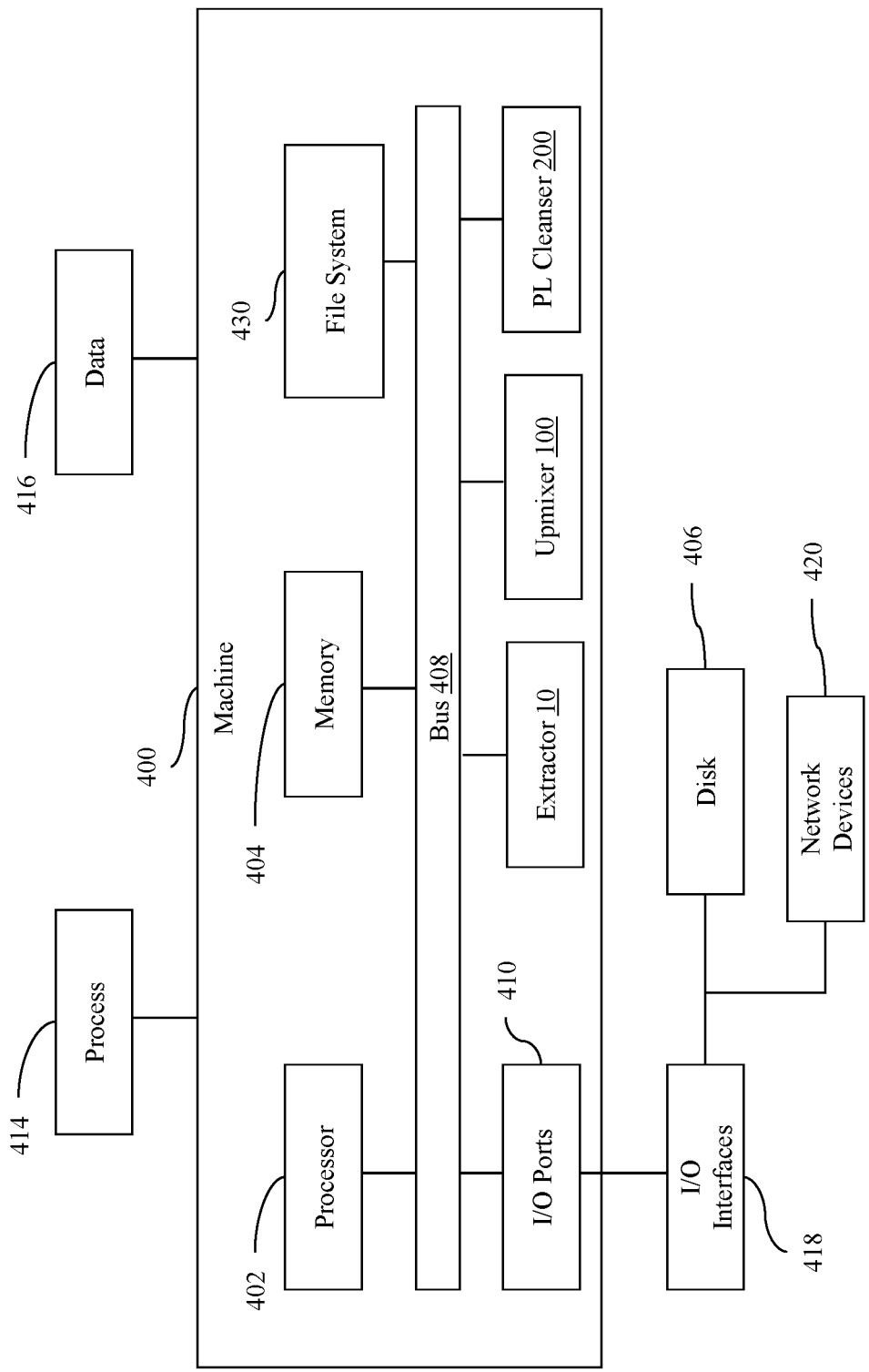
FIG. 5 illustrates a block diagram of an exemplary machine for extracting a common signal from at least two audio signals.

FIG. 5 illustrates a block diagram of an exemplary machine 400 for extracting a common signal from at least two audio signals. The machine 400 includes a processor 402, a memory 404, and I/O Ports 410 operably connected by a bus 408.

In one example, the machine 400 may transmit input and output signals including the signals L, R, C, O, PL, A, B, etc. described above via, for example, I/O Ports 410 or I/O Interfaces 418. The machine 400 may also include the extractor 10, upmixer 100, and peak limiter cleanser 200 and all of their components. Thus, the extractor 10, upmixer 100, and peak limiter cleanser 200 may be implemented in machine 400 as hardware, firmware, software, or combinations thereof and, thus, the machine 400 and its components may provide means for performing functions described herein as performed by the extractor 10, upmixer 100, and peak limiter cleanser 200.

The processor 402 can be a variety of various processors including dual microprocessor and other multi-processor architectures. The memory 404 can include volatile memory or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 406 may be operably connected to the machine 400 via, for example, an I/O Interfaces (e.g., card, device) 418 and an I/O Ports 410. The disk 406 can include, but is not limited to, devices like a magnetic disk drive, a solid state disk drive, a floppy disk drive, a tape drive, a Zip drive, a flash memory card, or a memory stick. Furthermore, the disk 406 can include optical drives like a CD-ROM, a CD recordable drive (CD-R drive), a CD rewriteable drive (CD-RW drive), or a digital video ROM drive (DVD ROM). The memory 404 can store processes 414 or data 416, for example. The disk 406 or memory 404 can store an operating system that controls and allocates resources of the machine 400.

The bus 408 can be a single internal bus interconnect architecture or other bus or mesh architectures. While a single bus is illustrated, it is to be appreciated that machine 400 may communicate with various devices, logics, and peripherals using other busses that are not illustrated (e.g., PCIE, SATA, Infiniband, 1394, USB, Ethernet). The bus 408 can be of a variety of types including, but not limited to, a memory bus or memory controller, a peripheral bus or external bus, a crossbar switch, or a local bus. The local bus can be of varieties including, but not limited to, an industrial standard architecture (ISA) bus, a microchannel architecture (MCA) bus, an extended ISA (EISA) bus, a peripheral component interconnect (PCI) bus, a universal serial (USB) bus, and a small computer systems interface (SCSI) bus.

The machine 400 may interact with input/output devices via I/O Interfaces 418 and I/O Ports 410. Input/output devices can include, but are not limited to, a keyboard, a microphone, a pointing and selection device, cameras, video cards, displays, disk 406, network devices 420, and the like. The I/O Ports 410 can include but are not limited to, serial ports, parallel ports, and USB ports.

The machine 400 can operate in a network environment and thus may be connected to network devices 420 via the I/O Interfaces 418, or the I/O Ports 410. Through the network devices 420, the machine 400 may interact with a network. Through the network, the machine 400 may be logically connected to remote devices. The networks with which the machine 400 may interact include, but are not limited to, a local area network (LAN), a wide area network (WAN), and other networks. The network devices 420 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), Zigbee (IEEE 802.15.4) and the like. Similarly, the network devices 420 can connect to WAN technologies including, but not limited to, point to point links, circuit switching networks like integrated services digital networks (ISDN), packet switching networks, and digital subscriber lines (DSL). While individual network types are described, it is to be appreciated that communications via, over, or through a network may include combinations and mixtures of communications.

While example systems, methods, and so on, have been illustrated by describing examples, and while the examples have been described in considerable detail, it is not the intention of the applicants to restrict or in any way limit scope to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

The invention claimed is:

1. A machine or group of machines for extracting a common signal from at least two audio signals, comprising:
   a summer configured to receive the at least two audio signals including a first signal and a second signal and to sum the first signal and the second signal to obtain a first+second signal;
   a subtractor configured to subtract the second signal from the first signal to obtain a first−second signal;
   at least one transformer configured to transform the first+second signal and the first−second signal to frequency domain representations of the first+second signal and the first−second signal, respectively;
   a processor configured to calculate absolute value of the frequency domain representation of the first+second signal and absolute value of the frequency domain representation of the first−second signal;
   a subtractor configured to subtracting the absolute value of the frequency domain representation of the first−second signal from the absolute value of the frequency domain representation of the first+second signal to obtain a difference signal;
   a multiplier configured to multiply the difference signal or the difference signal with its gain adjusted times the frequency domain representation of the first+second signal to obtain a product signal;
   a divider configured to divide the product signal by the absolute value of the frequency domain representation of the first+second signal or by the absolute value of the frequency domain representation of the first+second signal adjusted upwards, to obtain a frequency domain representation of the common signal; and
   a transformer configured to transform the frequency domain representation of the common signal to the common signal in the time domain.

2. The machine or group of machines of claim 1, wherein the at least two audio signals correspond to a left channel and a right channel in a stereo system.

3. The machine or group of machine of claim 2, comprising:
   a subtractor configured to subtract the common signal, a portion of the common signal, the common signal with its gain adjusted or the portion with its gain adjusted from the first signal or the first signal delayed to obtain a left rear signal or a right rear signal in a surround system.

4. The machine or group of machines of claim 2, comprising:
   a subtractor configured to subtract the common signal, a portion of the common signal, the common signal with its gain adjusted or the portion with its gain adjusted from the first signal or the first signal delayed to obtain a left rear signal or a right rear signal; and
   a summer configured to sum the common signal, a portion of the common signal, the common signal with its gain adjusted or the portion with its gain adjusted to the left rear signal or the right rear signal to obtain a sum, and
   an attenuator configured to adjust gain of the sum to obtain a left front signal or a right front signal in a surround system.

5. The machine or group of machines of claim 2, comprising:
   a loudspeaker configured to receive a portion of the common signal as a center channel signal.

6. The machine or group of machines of claim 2, comprising:
   a low-pass filter and a delayer configured to filter and delay the first+second signal to obtain a low frequency effect signal.

7. The machine or group of machines of claim 1, wherein the at least two audio signals correspond to an original signal and a first peak-limited version of the original signal, the common signal representing a second peak-limited version of the original signal without at least some undesirable spectral information.

8. A method for extracting a common signal from at least two audio signals, the method comprising:
   receiving the at least two audio signals including a first signal and a second signal;
   summing the first signal and the second signal to obtain a first+second signal;
   subtracting the second signal from the first signal to obtain a first−second signal;
   transforming the first+second signal and the first−second signal to frequency domain representations of the first+second signal and the first−second signal, respectively;
   calculating absolute value of the frequency domain representation of the first+second signal and absolute value of the frequency domain representation of the first−second signal;
   subtracting the absolute value of the frequency domain representation of the first−second signal from the absolute value of the frequency domain representation of the first+second signal to obtain a difference signal;
   multiplying the difference signal or the difference signal with its gain adjusted times the frequency domain representation of the first+second signal to obtain a product signal;
   dividing the product signal by the absolute value of the frequency domain representation of the first+second signal or by the absolute value of the frequency domain representation of the first+second signal adjusted upwards, to obtain a frequency domain representation of the common signal; and
   transforming the frequency domain representation of the common signal to the common signal in the time domain.

9. The method of claim 8, wherein the at least two audio signals correspond to a left channel and a right channel in a stereo system.

10. The method of claim 9, comprising:
    subtracting the common signal, a portion of the common signal, the common signal with its gain adjusted or the portion with its gain adjusted from the first signal or the first signal delayed to obtain a left rear signal or a right rear signal in a surround system.

11. The method of claim 9, comprising:
    subtracting the common signal, a portion of the common signal, the common signal with its gain adjusted or the portion with its gain adjusted from the first signal or the first signal delayed to obtain a left rear signal or a right rear signal; and
    summing the common signal, a portion of the common signal, the common signal with its gain adjusted or the portion with its gain adjusted to the left rear signal or the right rear signal, and adjusting gain of the sum to obtain a left front signal or a right front signal in a surround system.

12. The method of claim 9, comprising:
    applying a portion of the common signal as a center channel signal.

13. The method of claim 9, comprising:
low-pass filtering and delaying the first+second signal to obtain a low frequency effect signal.

14. The method of claim 8, wherein the at least two audio signals correspond to an original signal and a first peak-limited version of the original signal, the common signal representing a second peak-limited version of the original signal without at least some undesirable spectral information.

15. A computer program product for extracting a common signal from at least two audio signals, the computer program product includes a non-transient computer-readable medium and comprising machine executable instructions which, when executed, cause the machine to perform steps of a method comprising:
receiving the at least two audio signals including a first signal and a second signal;
summing the first signal and the second signal to obtain a first+second signal;
subtracting the second signal from the first signal to obtain a first−second signal;
transforming the first+second signal and the first−second signal to frequency domain representations of the first+second signal and the first−second signal, respectively;
calculating absolute value of the frequency domain representation of the first+second signal and absolute value of the frequency domain representation of the first−second signal;
subtracting the absolute value of the frequency domain representation of the first−second signal from the absolute value of the frequency domain representation of the first+second signal to obtain a difference signal;
multiplying the difference signal or the difference signal with its gain adjusted times the frequency domain representation of the first+second signal to obtain a product signal;
dividing the product signal by the absolute value of the frequency domain representation of the first+second signal or by the absolute value of the frequency domain representation of the first+second signal adjusted upwards, to obtain a frequency domain representation of the common signal; and
transforming the frequency domain representation of the common signal to the common signal in the time domain.

16. The computer program product of claim 15, wherein the at least two audio signals correspond to a left channel and a right channel in a stereo system.

17. The computer program product of claim 16, comprising:
subtracting the common signal, a portion of the common signal, the common signal with its gain adjusted or the portion with its gain adjusted from the first signal or the first signal delayed to obtain a left rear signal or a right rear signal in a surround system.

18. The computer program product of claim 16, comprising:
subtracting the common signal, a portion of the common signal, the common signal with its gain adjusted or the portion with its gain adjusted from the first signal or the first signal delayed to obtain a left rear signal or a right rear signal; and
summing the common signal, a portion of the common signal, the common signal with its gain adjusted or the portion with its gain adjusted to the left rear signal or the right rear signal, and adjusting gain of the sum to obtain a left front signal or a right front signal in a surround system.

19. The computer program product of claim 16, comprising:
low-pass filtering and delaying the first+second signal to obtain a low frequency effect signal.

20. The computer program product of claim 15, wherein the at least two audio signals correspond to an original signal and a first peak-limited version of the original signal, the common signal representing a second peak-limited version of the original signal without at least some undesirable spectral information.

* * * * *